US009111919B2

(12) United States Patent
Lichtenwalner et al.

(10) Patent No.: US 9,111,919 B2
(45) Date of Patent: Aug. 18, 2015

(54) FIELD EFFECT DEVICE WITH ENHANCED GATE DIELECTRIC STRUCTURE

(71) Applicant: Cree, Inc., Durham, NC (US)

(72) Inventors: Daniel Jenner Lichtenwalner, Raleigh, NC (US); Anant Kumar Agarwal, Arlington, VA (US); Lin Cheng, Chapel Hill, NC (US); Vipindas Pala, Morrisville, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 51 days.

(21) Appl. No.: 14/045,466

(22) Filed: Oct. 3, 2013

(65) Prior Publication Data
US 2015/0097226 A1    Apr. 9, 2015

(51) Int. Cl.
*H01L 29/66* (2006.01)
*H01L 29/49* (2006.01)
*H01L 29/78* (2006.01)

(52) U.S. Cl.
CPC ...... *H01L 29/4925* (2013.01); *H01L 29/66712* (2013.01); *H01L 29/7802* (2013.01)

(58) Field of Classification Search
CPC . H01L 29/6659; H01L 29/49; H01L 29/1095; H01L 29/66325; H01L 27/0823; H01L 21/82285
USPC ........... 257/77, 135, 220, 288, 263, 302, 350; 438/197, 137, 156, 192, 206, 212, 133
See application file for complete search history.

(56) References Cited

U.S. PATENT DOCUMENTS

| | | | |
|---|---|---|---|
| 2002/0038891 A1* | 4/2002 | Ryu et al. | 257/350 |
| 2004/0079989 A1* | 4/2004 | Kaneko et al. | 257/328 |
| 2004/0119076 A1* | 6/2004 | Ryu | 257/77 |
| 2006/0118818 A1* | 6/2006 | Shimoida et al. | 257/183 |
| 2008/0105949 A1* | 5/2008 | Zhang et al. | 257/584 |
| 2009/0189228 A1* | 7/2009 | Zhang et al. | 257/402 |
| 2010/0301335 A1* | 12/2010 | Ryu et al. | 257/49 |
| 2011/0147764 A1 | 6/2011 | Dhar et al. | |
| 2012/0223330 A1 | 9/2012 | Dhar et al. | |
| 2012/0326163 A1 | 12/2012 | Dhar et al. | |
| 2012/0329216 A1 | 12/2012 | Dhar et al. | |
| 2013/0234161 A1* | 9/2013 | Shimizu et al. | 257/77 |
| 2013/0240906 A1* | 9/2013 | Shimizu et al. | 257/77 |

OTHER PUBLICATIONS

Okamoto, Dai et al., "Removal of Near-Interface Traps at SiO2/4H-SiC (0001) Interfaces by Phosphorus Incorporation," vol. 96, Applied Physics Letters, May 2010, pp. 203508-1-203508-3 (3 pages).
Bhat, Navakanta et al., "Charge Trap Generation in LPCVD Oxides Under High Field Stressing," IEEE Transactions on Electron Devices, vol. 43, No. 4, Apr. 1996, pp. 554-560.

* cited by examiner

*Primary Examiner* — Jarrett Stark
*Assistant Examiner* — Shahed Ahmed
(74) *Attorney, Agent, or Firm* — Anthony J. Josephson

(57) ABSTRACT

A vertically oriented field effect device has a body and an enhance gate structure. The body includes a JFET (junction field effect transistor) region disposed between junction implants that extend into the body from a top surface of the body. The gate structure includes a supplemental gate dielectric, a primary gate dielectric, and a gate contact. The supplemental gate dielectric is formed over the top surface of the body above the JFET region, such that the supplemental dielectric is separated from the junction implants by a gap. The primary gate dielectric is formed over the supplemental gate dielectric, above the gap over the top surface of the body, and over at least a portion of the junction implants. The gate contact is formed over the primary gate dielectric.

29 Claims, 17 Drawing Sheets

FIELD EFFECT DEVICE WITH ENHANCED GATE DIELECTRIC STRUCTURE

GOVERNMENT SUPPORT

This invention was made with government funds under contract number W911NF-10-2-0038 awarded by the U.S. Army. The U.S. Government has rights in this invention.

FIELD OF THE DISCLOSURE

The present disclosure relates to power transistor devices, and in particular to field effect devices, such as a metal oxide semiconductor field effect transistor (MOSFET).

BACKGROUND

A power metal-oxide-semiconductor field-effect transistor (MOSFET) is a type of MOSFET that is adapted for use in high power applications. Generally, a power MOSFET has a vertical structure, wherein a source and gate contact are located on a top surface of the body of the MOSFET, and the drain contact is located on a bottom surface of the body of the MOSFET. These "vertical" MOSFETs are sometimes referred to as vertical diffused MOSFETs (VDMOSFETs) or double-diffused MOSFETs (DMOSFETs).

A conventional vertical MOSFET generally includes a substrate and a drift layer formed over the substrate. One or more junction implants extend into the drift layer from the top surface of the drift layer. A junction gate field effect transistor (JFET) region is provided between the junction implants. Each one of the junction implants is formed by an ion implantation process and will include at least a source region. Each source region is formed in a shallow portion beneath the top surface of the drift layer. A gate dielectric is formed along the top surface of the drift layer and extends laterally between each source region. A gate contact is formed over the gate dielectric. Source contacts are formed over source regions, and a drain contact is formed on the bottom surface of the substrate.

The long term reliability of the vertical MOSFET is often a function of the quality of the interface between the JFET region and the gate dielectric. Further, this interface dictates the MOSFET's gate-to-drain capacitance, which directly affects switching speeds; gate leakage currents in both the on and off states; and blocking voltages in the off state. Since there is always a need to improve device reliability, reduce gate-to-drain capacitance, and reduce leakage currents, there is a need to improve the interface between the JFET region and the gate dielectric in vertical MOSFETs and other field effect devices.

SUMMARY

The present disclosure relates to a vertically oriented field effect device, such as a MOSFET, insulated gate bipolar transistor, and the like. The field effect device has a body and an enhanced gate structure. The body includes a JFET (junction field effect transistor) region disposed between junction implants that extend into the body from a top surface of the body. The gate structure includes a supplemental gate dielectric, a primary gate dielectric, and a gate contact. The supplemental gate dielectric is formed over the top surface of the body above the JFET region, such that the supplemental dielectric is separated from the junction implants by a gap. The primary gate dielectric is formed over the supplemental gate dielectric, above the gap over the top surface of the body, and over at least a portion of the junction implants. The gate contact is formed over the primary gate dielectric.

In one embodiment, a trench is formed into the JFET region from the top surface and the supplemental gate dielectric is formed in the trench. The trench and the supplemental gate dielectric are separated from the junction implants by the gap. In another embodiment, no trench is provided in the JFET region, and as such, the top surface of the body is substantially planar over the JFET region and the junction implants. The side walls of the supplemental gate dielectric may be perpendicular to or form an acute angle with the top surface of the body.

The supplemental gate dielectric and the primary gate dielectric may be formed from the same or different materials. For example, when a silicon carbide (SiC) body is employed, the supplemental gate dielectric and the primary gate dielectric may be formed from silicon dioxide ($SiO_2$). In another example, the supplemental gate dielectric may be formed from aluminum oxide ($AL_2O_3$), magnesium oxide, or the like, while the primary gate dielectric may be formed from silicon dioxide ($SiO_2$). The supplemental gate dielectric may also be formed from a nitride. In certain embodiments, the supplemental gate dielectric is formed from a first material, the JFET region is formed from a second material, and the first material has a higher bandgap than that the second material. For instance, the first material used for the supplemental gate dielectric may have a bandgap that is at least 1.5 or at least two times that of the second material used for the JFET region.

Exemplary methods for forming the vertically oriented field effect device are also disclosed. One method is as follows. Initially, the body is provided. The body will generally include the JFET region, which is disposed between junction implants that extend into the body from the top surface of the body. Next, the supplemental gate dielectric is formed over the top surface of the body above the JFET region, such that the supplemental dielectric is separated from the junction implants by the gap. In one embodiment, the supplemental gate dielectric is annealed prior to forming the primary gate dielectric. After the supplemental gate dielectric is formed, the primary gate dielectric is formed over the supplemental gate dielectric, above the gap over the top surface of the body, and over at least a portion of the junction implants. After the primary gate dielectric is formed, the gate contact is formed over the primary gate dielectric. Source contacts may then be formed over source regions provided on the junction implants, and a drain contact may be provided on the bottom surface of the body.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
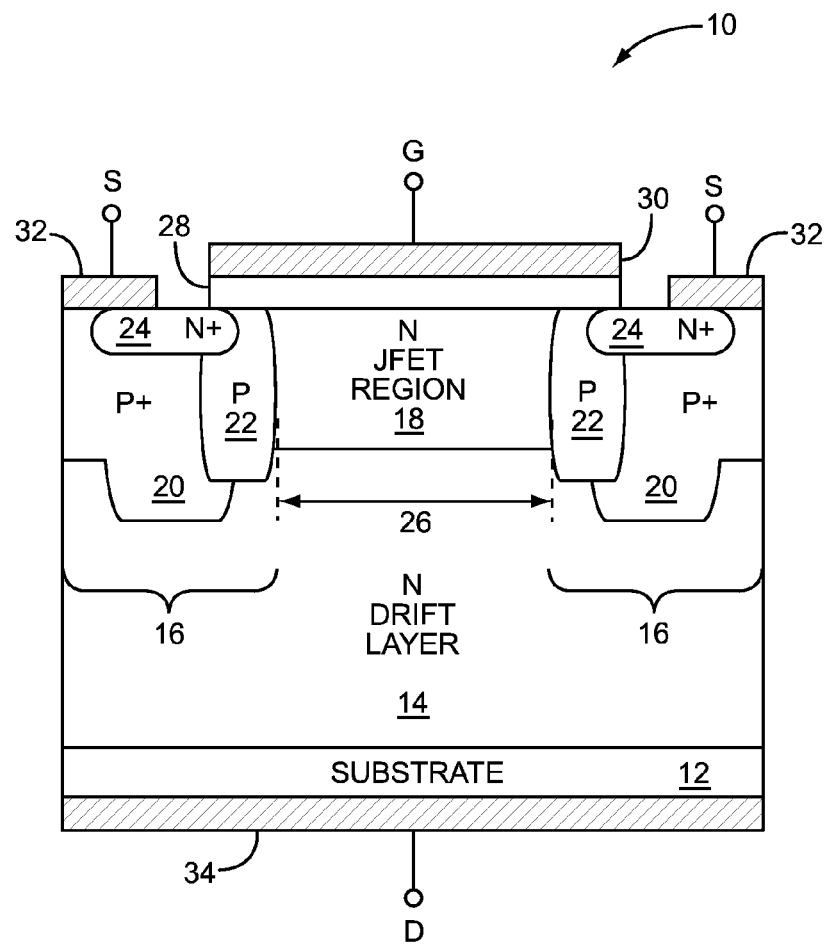
FIG. 1 shows a schematic representation of a conventional MOSFET.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a conventional MOSFET 10, which has a vertical orientation and is particularly useful in high power applications. The conventional MOSFET 10 includes a substrate 12 and a drift layer 14 formed over the substrate 12. One or more junction implants 16 extend into the drift layer 14 from a top surface of the drift layer 14, wherein the top surface is opposite the substrate 12. A junction gate field effect transistor (JFET) region 18 is provided between the junction implants 16. Each one of the junction implants 16 is formed by an ion implantation process, and includes a deep well region 20, a base region 22, and a source region 24.

Each deep well region 20 extends from a corner of the drift layer 14 opposite the substrate 12 downwards towards the substrate 12 and inwards towards the center of the drift layer 14. The deep well region 20 may be formed uniformly or may include one or more protruding regions, as shown in FIG. 1. Each base region 22 extends downward from the top surface of the drift layer 14 towards the substrate 12 along a portion of the inner edge of each one of the deep well regions 20. Each source region 24 is formed in a shallow portion beneath the top surface of the drift layer 14 and generally overlaps a portion of the deep well region 20 and the base region 22, without extending outside of either. The JFET region 18 defines a channel width 26 between each one of the junction implants 16. In a typical configuration, the drift layer 14 and JFET region 18 are moderately doped with an N-type doping material (N), the deep well regions 20 are heavily doped with a P-type doping material (P+), the base regions 22 are moderately doped with a P-type doping material (P), and the source regions 24 are heavily doped with an N-type doping material (N+).

A gate dielectric 28 is formed along the top surface of the drift layer 14 and extends laterally between each source region 24, such that portions of the gate dielectric 28 extend over the base regions 22 and at least a portion of the source regions. A gate contact 30 is formed over the gate dielectric 28. Source contacts 32 are formed on the top surface of the drift layer 14 and over the source regions 24, such that each one of the source contacts 32 partially overlaps portions of both the source region 24 and the deep well region 20 without contacting the gate dielectric 28 or the gate contact 30. A drain contact 34 is located on the bottom surface of the substrate 12 opposite the drift layer 14.

In operation, when a biasing voltage is not applied to the gate contact 30 and the drain contact 34 is positively biased, the P-N junction between each deep well region 20 and the drift layer 14 is reverse biased, thereby placing the conventional MOSFET 10 in an OFF state. In the OFF state of the conventional MOSFET 10, any voltage between the source contacts 32 and drain contact 34 is supported by the drift layer 14 and only leakage currents will flow between these contacts. Due to the vertical structure of the conventional MOSFET 10, large voltages may be placed between the source contacts 32 and the drain contact 34 without damaging the device.

Figure 2:
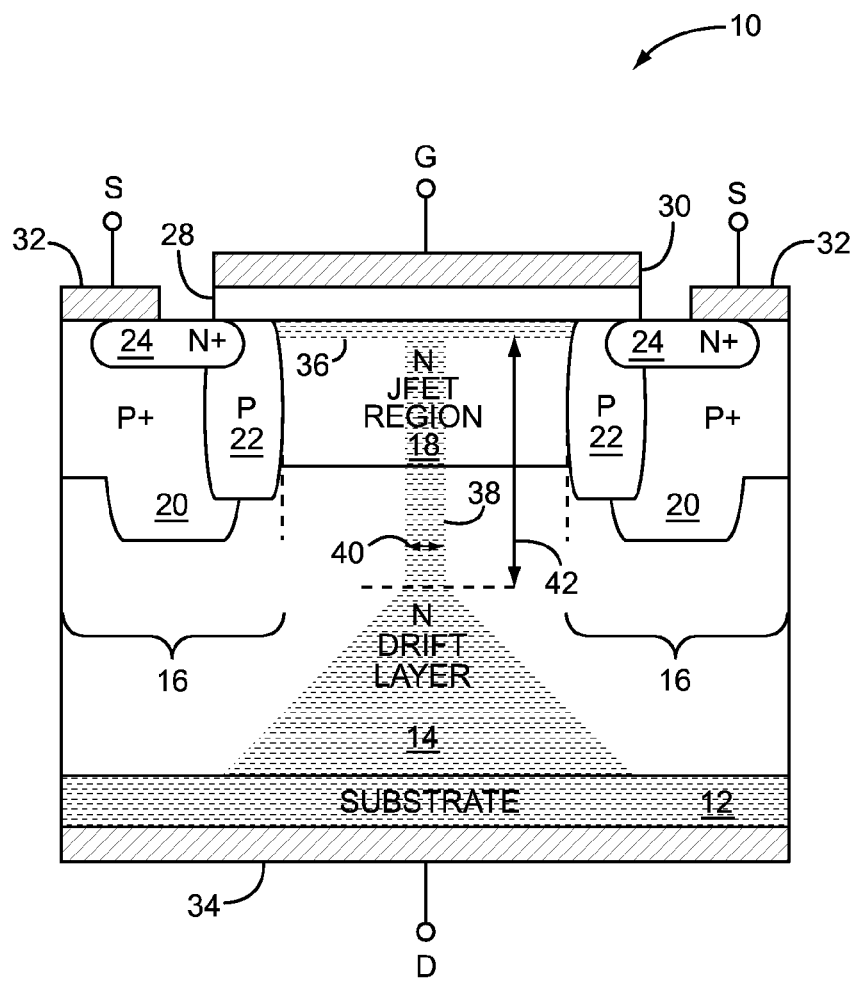
FIG. 2 shows details of the operation of the conventional MOSFET shown in FIG. 1.

FIG. 2 illustrates current flow in the conventional MOSFET 10 when the device is in an ON state. When a positive bias is applied to the gate contact 30 of the conventional MOSFET 10, an inversion layer channel 36 is formed just below the top surface of the drift layer 14 underneath the gate contact 30, thereby placing the conventional MOSFET 10 in an ON state. In the ON state of the conventional MOSFET 10, current (shown by the shaded region) flows laterally from each one of the source contacts 32 through the inversion layer channel 36 and into the JFET region 18 of the drift layer 14. Once in the middle of the JFET region 18, the current flows downward through the drift layer 14 towards the drain contact 34. An electric field presented by P-N junctions formed between the deep well region 20, the base region 22, and the drift layer 14 forces the current to flow through the middle of the JFET region 18. The middle of the JFET region 18 in which the current flows is referred to as a JFET channel 38, which has a relatively narrow JFET channel width 40. After reaching a certain depth, which is referred to as a spreading depth 42, the electric field presented by the junction implants 16 begins to diminish. The diminishing electric field allows the current to spread out as is flows further downward through the drift layer 14, as shown in FIG. 2.

Notably, the electric fields formed by the junctions between the deep well region 20, the base region 22, and the drift layer 14 radiate into the gate dielectric 28 and can physically degrade the gate dielectric 28 over time. Degradation of the gate dielectric 28 degrades performance and can lead to complete failure of the conventional MOSFET 10. A way to combat the destructive forces on the gate dielectric 28 as well as to enhance the overall performance of the conventional MOSFET 10 is described below.

Figure 3:
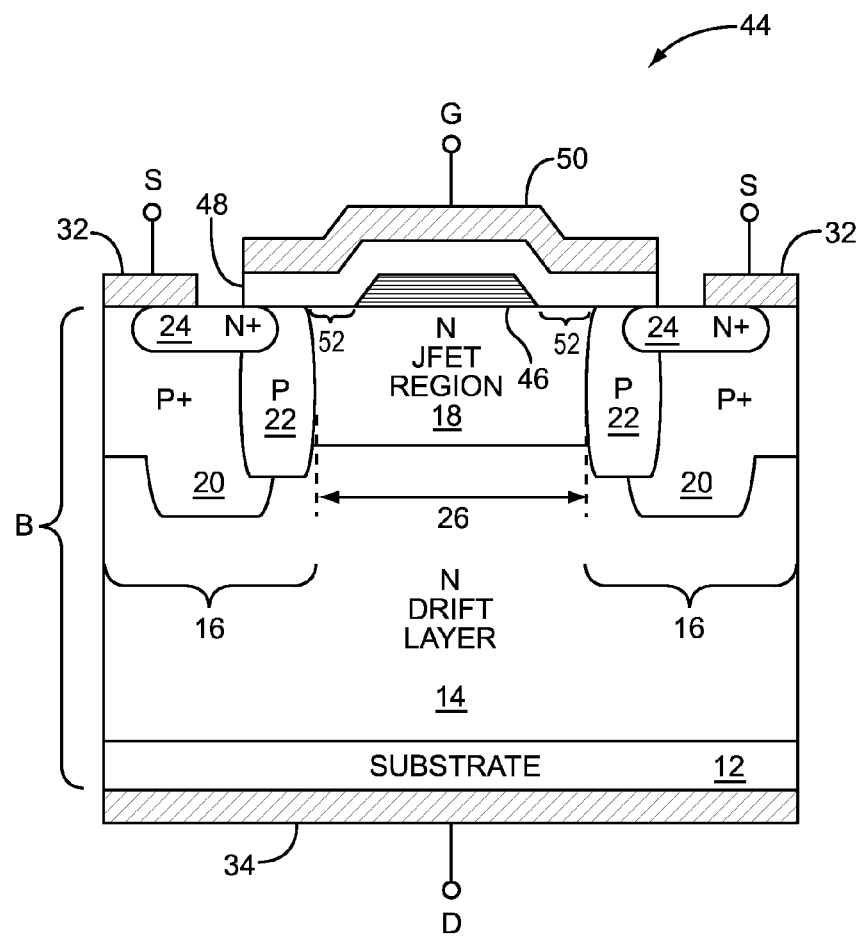
FIG. 3 shows a MOSFET according to a first embodiment of the present disclosure.

With reference to FIG. 3, a MOSFET 44 is provided with a gate structure according to a first embodiment of the disclosure. Outside of the gate structure, the body B of the MOSFET 44 is effectively the same as that of the conventional MOSFET 10, which was illustrated in FIGS. 1 and 2. The gate structure includes a supplemental gate dielectric 46, a primary gate dielectric 48 over the supplemental gate dielectric 46, and a gate contact 50 over the primary gate dielectric 48. Exemplary materials to use for the supplemental and primary gate dielectrics 46, 48 include various oxides and nitrides, which are discussed further below. For the embodiment of FIG. 3, the top surface of the drift layer 14 is substantially planar between the source regions 24 and over the JFET region 18. The supplemental gate dielectric 46 is formed on the top surface of the drift layer 14 over a central portion of the JFET region 18, such that there is a gap 52 between the outer edges of the supplemental gate dielectric 46 and the junction implants 16, including the base regions 22.

The primary gate dielectric 48 is formed over the supplemental gate dielectric 46 and portions of the top surface of the drift layer 14 outside of the supplemental gate dielectric 46. In particular, the primary gate dielectric 48 covers the top surface and side walls of the supplemental gate dielectric 46 as well as portions of the top surface of the drift layer 14 between the side walls of the supplemental gate dielectric 46 and portions of the source region 24, such that portions of the primary gate dielectric 48 extend over the base regions 22 and at least a portion of the source regions 24. A gate contact 50 is formed over the primary gate dielectric 48. In certain embodiments, the gate contact 50 also extends over at least a portion of the source regions 24, wherein the primary gate dielectric 48 isolates the gate contact 50 from any portion of the deep well regions 20, base regions 22, and source regions 24 of the junction implants 16. The drain contact 34 is located on the bottom surface of the substrate 12 opposite the drift layer 14.

In essence, the supplemental gate dielectric 46 allows the overall gate dielectric to be relatively thick throughout a central portion that resides over a central portion of the JFET region 18 and relatively thin throughout a perimeter portion of the JFET region 18 that resides around a perimeter area of the JFET region 18. This perimeter portion corresponds to the gap 52 between the outer edges of the supplemental gate dielectric 46 and the junction implants 16, including the base regions 22. In various embodiments, the gap 52 is between about 0.05 and 0.1 microns, 0.1 and 0.2 microns, and 0.2 and 0.4 microns. The side walls of the supplemental gate dielectric 46 may be perpendicular to or form an acute angle relative to the top surface of the drift layer 14.

Figure 4:
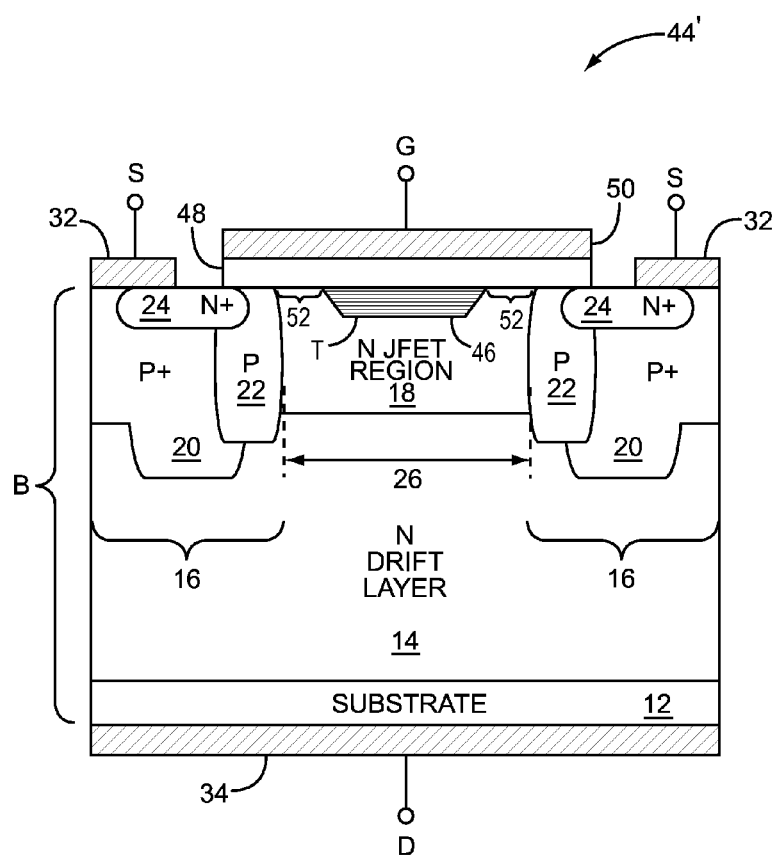
FIG. 4 shows a MOSFET according to a second embodiment of the present disclosure.

With reference to FIG. 4, a second embodiment of the MOSFET 44' is provided. In this embodiment, the gate structure is characterized by forming the supplemental gate dielectric 46 in a trench T, which is formed in the top surface of the drift layer 14. The trench T is etched or otherwise formed on the top surface of the drift layer 14 in a central portion of the JFET region 18, such that there is a gap 52 between the outer edges of the trench T and the junction implants 16, including the base regions 22. When the trench T is filled with the supplemental gate dielectric 46, the gap 52 remains between the outer edges of the supplemental gate dielectric 46 and the junction implants 16, including the base regions 22. As illustrated, the supplemental gate dielectric 46 may completely fill the trench T such that the top surface of the supplemental gate dielectric 46 is substantially level with the top surface of the drift layer 14. Alternatively, the supplemental gate dielectric 46 may be formed such that the top surface of the supplemental gate dielectric 46 resides above or below the top surface of the drift layer 14. The trench T may be formed to set the desired thickness, sidewall profile (perpendicular, angled), and corner shape (rounded, square, angled) for the supplemental gate dielectric 46 as well as set the width of the gap 52.

The primary gate dielectric 48 is formed over the supplemental gate dielectric 46. Further, the primary gate dielectric 48 is formed over portions of the top surface of the drift layer 14 outside of the supplemental gate dielectric 46. In particular, the primary gate dielectric 48 covers portions of the top surface of the drift layer 14 between the side walls of the supplemental gate dielectric 46 and portions of the source region 24, such that portions of the primary gate dielectric 48 extend over the base regions 22 and at least a portion of the source regions 24. A gate contact 50 is formed over the primary gate dielectric 48. In certain embodiments, the gate contact 50 also extends over at least a portion of the source regions 24, wherein the primary gate dielectric 48 isolates the gate contact 50 from any portion of the deep well regions 20, base regions 22, and source regions 24 of the junction implants 16. A drain contact 34 is located on the bottom surface of the substrate 12 opposite the drift layer 14.

For a vertically oriented MOSFET 44, the enhanced gate structure of the present disclosure allows the effective thickness of the gate dielectric over the channel to maintain a desired thickness while the gate dielectric over the central portion of the JFET region 18 is substantially thicker than that provided over the channel. Particularly for Silicon Carbide (SiC) based devices, providing a thicker gate dielectric over the central portion of the JFET region 18 helps provide a higher quality interface between the gate dielectric and the drift layer 14. Improving this interface is beneficial, especially when either or both of the gate dielectric or the drift layer 14 are chemically modified around the channel region in an effort to further increase electron mobility.

Providing a thicker gate dielectric over the central portion of the JFET region 18 also functions to reduce the gate dielectric fields above the JFET region 18 in both the ON and OFF states as well as to reduce the gate-to-drain capacitance for the MOSFET 44. Reducing the gate-to-drain capacitance results in better switching performance. Reducing the gate dielectric fields not only improves device reliability, but also results in lower gate leakage in the ON state as well as lower gate leakage and higher breakdown voltages in the OFF state, or blocking state.

Figure 5A:
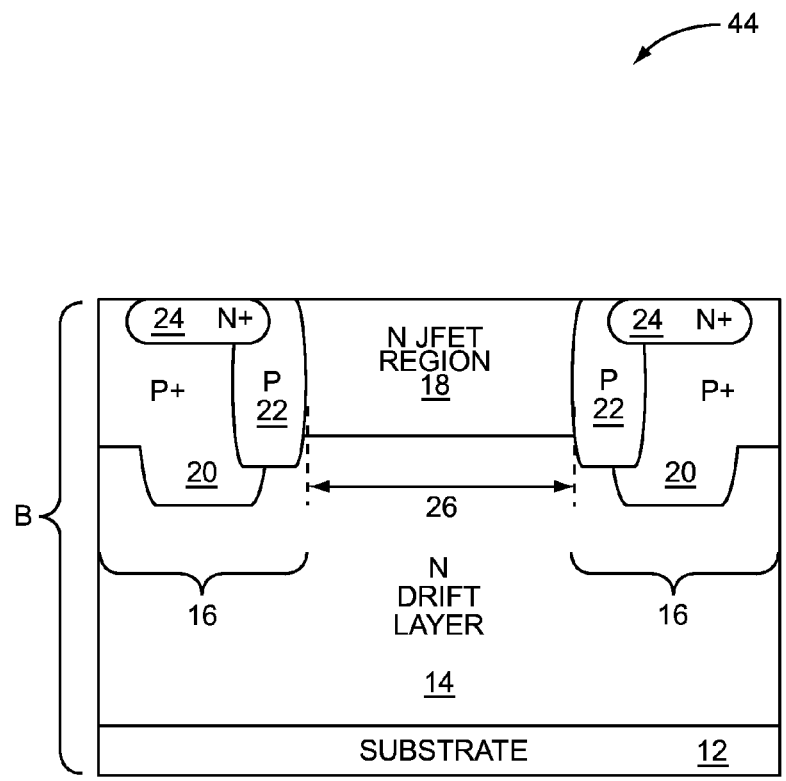
FIGS. 5A through 5E illustrate an exemplary process for manufacturing the MOSFET shown in FIG. 3.

With reference to FIGS. 5A through 5E, a process for forming the gate structure for the embodiment illustrated in FIG. 3 is described. As illustrated in FIG. 5A, the body B of a precursor for the MOSFET 44 is provided wherein the junction implants 16 and the JFET region 18 are already formed in the drift layer 14. The drift layer 14 resides on the substrate 12. The top surface of the body B corresponds to the top surface of the drift layer 14 in this embodiment and is substantially planar. In one embodiment, the substrate 12 and the drift layer 14 are formed from silicon carbide (SiC). As described further below, other material systems are available; however, the SiC material system is used for the illustrated examples.

Figure 5B:
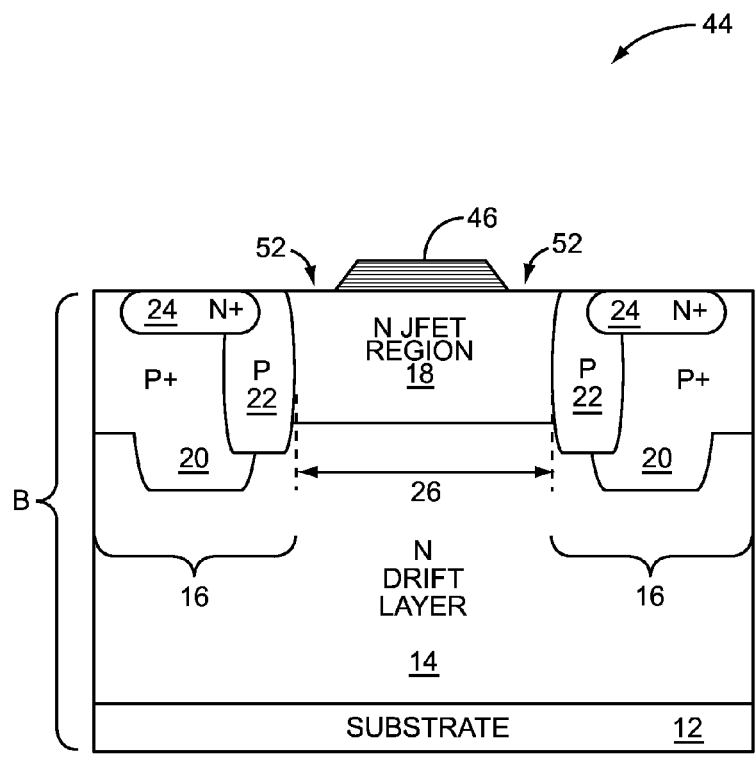

Next, a supplemental dielectric layer is formed over the top surface of the body B using a deposition or thermal growth process. The thickness of the supplemental dielectric layer will generally correspond to the desired thickness of the supplemental gate dielectric 46. Once formed, the supplemental dielectric layer is annealed at a relatively high temperature, such as between 1100 and 1300 Celsius for between 10 and 180 minutes. Once annealed, the supplemental dielectric layer is etched to form the supplemental gate dielectric 46 with the desired size, shape, side wall profile, and corner profile, as illustrated in FIG. 5B. Depending on the embodiment, the supplemental dielectric layer, and thus the supplemental gate dielectric 46, may be silicon dioxide ($SiO_2$), aluminum oxide ($Al_2O_3$), magnesium oxide (MgO), or like oxide. Silicon dioxide ($SiO_2$) provides a very effective oxide for the supplemental gate dielectric 46 in SiC-based applications.

Figure 5C:
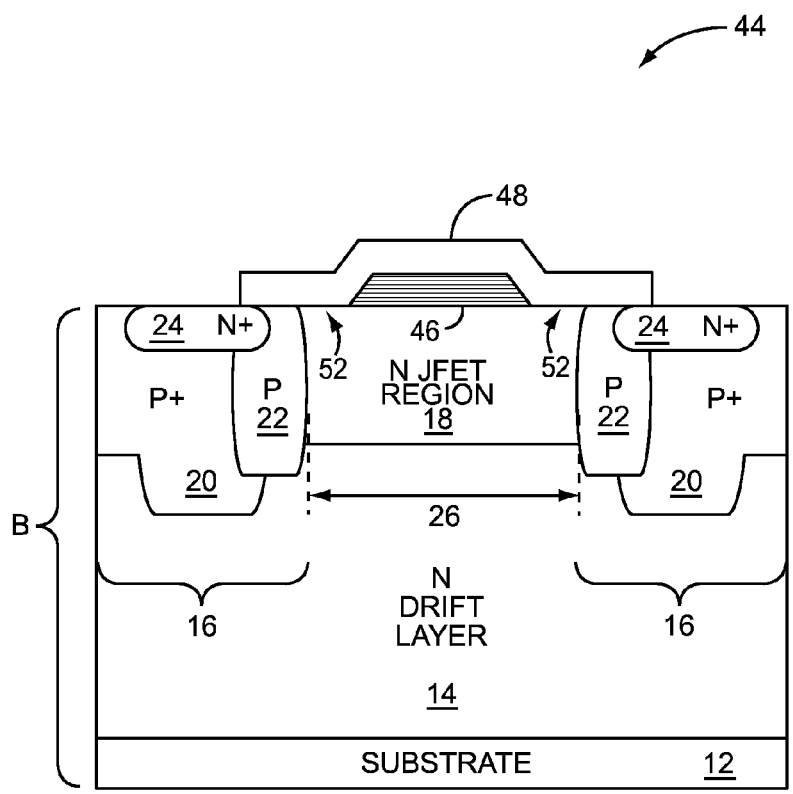

After the supplemental gate dielectric 46 is formed, a primary dielectric layer is formed over the supplemental gate dielectric 46 and at least a portion of the top surface of the body B using a deposition or thermal growth process. The thickness of the primary dielectric layer will generally correspond to the desired thickness of the primary gate dielectric 48. Once formed, the primary dielectric layer may be annealed and then etched to form the primary gate dielectric 48 with the desired size, shape, side wall profile, and corner profile, as illustrated in FIG. 5C. Depending on the embodiment, the primary dielectric layer, and thus the primary gate dielectric 48, may be silicon dioxide ($SiO_2$), aluminum oxide ($Al_2O_3$), magnesium oxide (MgO), or like oxide. As noted above, silicon dioxide ($SiO_2$) provides a very effective oxide for the primary gate dielectric 48 in SiC-based applications.

The supplemental gate dielectric 46 and the primary gate dielectric 48 may be of the same type. For example, both the supplemental gate dielectric 46 and the primary gate dielectric 48 may be silicon dioxide ($SiO_2$) in a silicon carbide (SiC) based MOSFET 44. Alternatively, the supplemental gate dielectric 46 and the primary gate dielectric 48 may be formed from different types of oxides. For example, the supplemental gate dielectric 46 may be magnesium oxide (MgO), and the primary gate dielectric 48 may be silicon dioxide ($SiO_2$). In another embodiment, the supplemental gate dielectric 46 may be aluminum oxide ($Al_2O_3$), and the primary gate dielectric 48 may be silicon dioxide ($SiO_2$) oxide. Also, various nitrides, such as aluminum nitride (AlN), may be used as the supplemental gate dielectric 46 as well as the primary gate dielectric 48. The oxides and nitrides may be mixed wherein one of the supplemental gate dielectric 46 and the primary gate dielectric 48 employs an oxide while the other employs a nitride.

In certain embodiments, the supplement gate dielectric 46 may benefit by being a higher dielectric constant oxide or nitride that also has a fairly wide bandgap (Eg). A higher dielectric constant (K) for the supplemental gate dielectric 46 will also help lower the fields therein. As introduced above, materials such as aluminum oxide ($Al_2O_3$), which has a bandgap of Eg ~8.8 eV, and magnesium oxide (MgO), which has a bandgap of Eg ~7.8 eV, are excellent candidates. It has shown to be beneficial for the supplement gate dielectric 46 to have a bandgap significantly wider (i.e. 1.5 times wider, two times wider) than the material used for the JFET region 18, or drift layer 14. For example, SiC has a bandgap of Eg ~3.3 eV). For a SiC-based device, the supplemental gate dielectric 46 may have a bandgap Eg that is wider than 4.95 (1.5×) or 6.6 (2×) than that of SiC.

In one embodiment, the thickness of the supplemental gate dielectric 46 may be about the same or greater than the thickness of the primary gate dielectric 48. In many instances, the thickness of the supplemental gate dielectric 46 is between about 20 and 100 nm. Accordingly, if the thickness of the supplemental gate dielectric 46 is about 50 nm, the thickness of the primary gate dielectric 48 may be about 50 nm or greater. In other embodiments, the thickness of the supplemental gate dielectric 46 is about 1.25, 1.5, 2 or up to 10 times greater than the thickness of the primary gate dielectric 48.

Figure 5D:
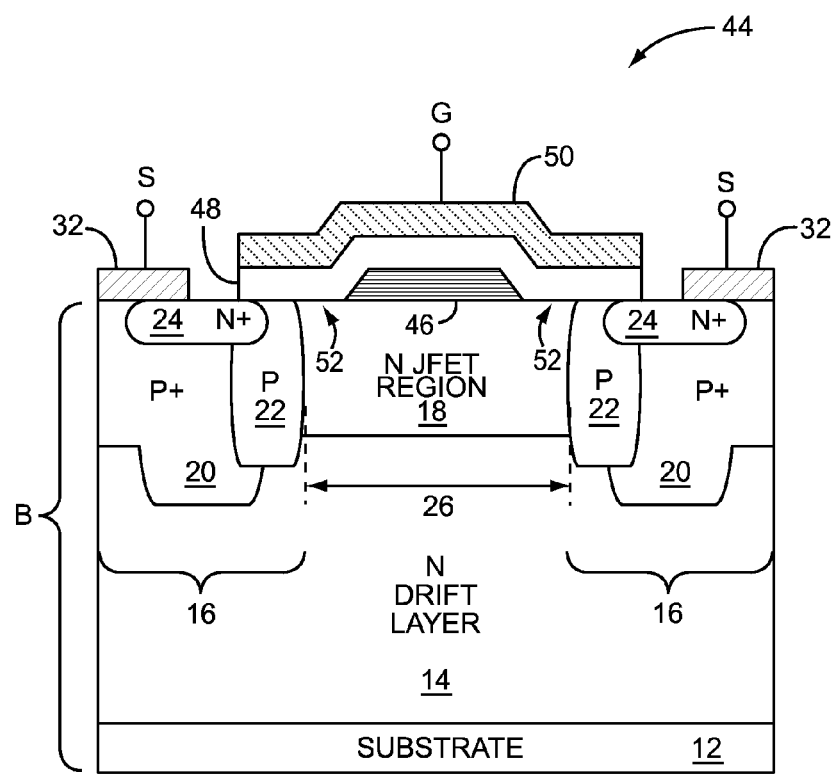
Figure 5E:
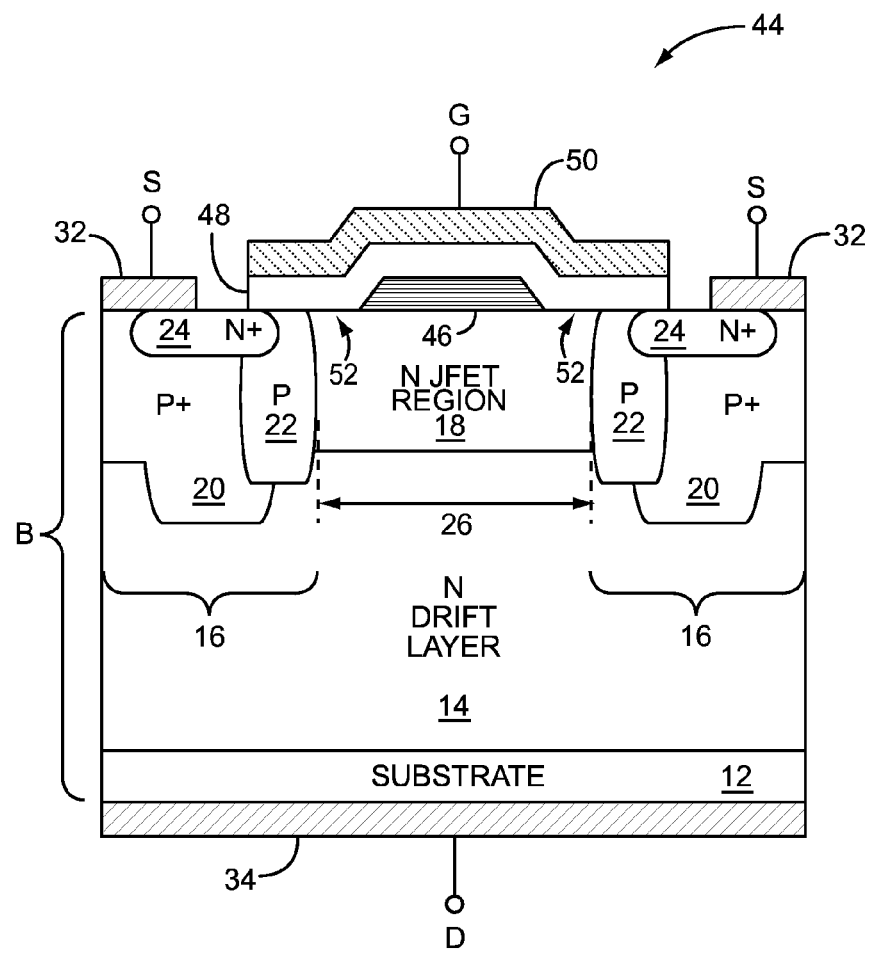

Next, the source contacts 32 and the gate contact 50 are formed, as illustrated in FIG. 5D in the same or successive steps. The source contacts 32 are formed over the top surface of the body B while the gate contact 50 is formed over the primary gate dielectric 48. Finally, the drain contact 34 is formed over the bottom surface of the substrate 12, as shown in FIG. 5E.

Figure 6A:
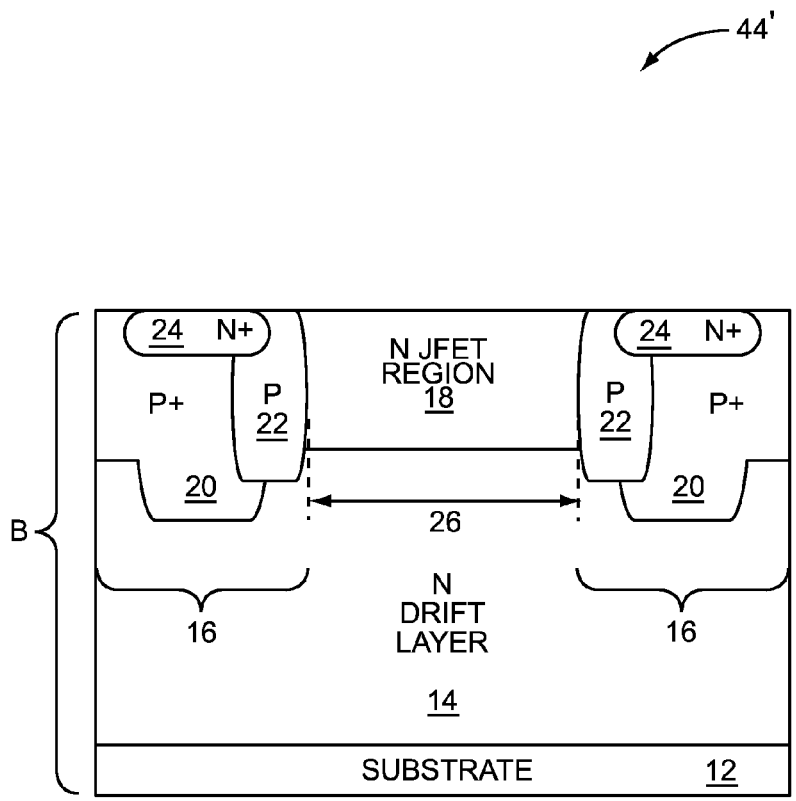
FIGS. 6A through 6F illustrate an exemplary process for manufacturing the MOSFET shown in FIG. 4.

With reference to FIGS. 6A through 6E, a process for forming the gate structure for the embodiment illustrated in FIG. 4 is described. In this embodiment, the supplemental gate dielectric 46 is formed in the trench T. As illustrated in FIG. 6A, the body B of a precursor for the MOSFET 44' is provided wherein the junction implants 16 and the JFET region 18 are already formed in the drift layer 14. The drift layer 14 resides on the substrate 12. The top surface of the body B corresponds to the top surface of the drift layer 14 in this embodiment and is substantially planar.

Figure 6B:
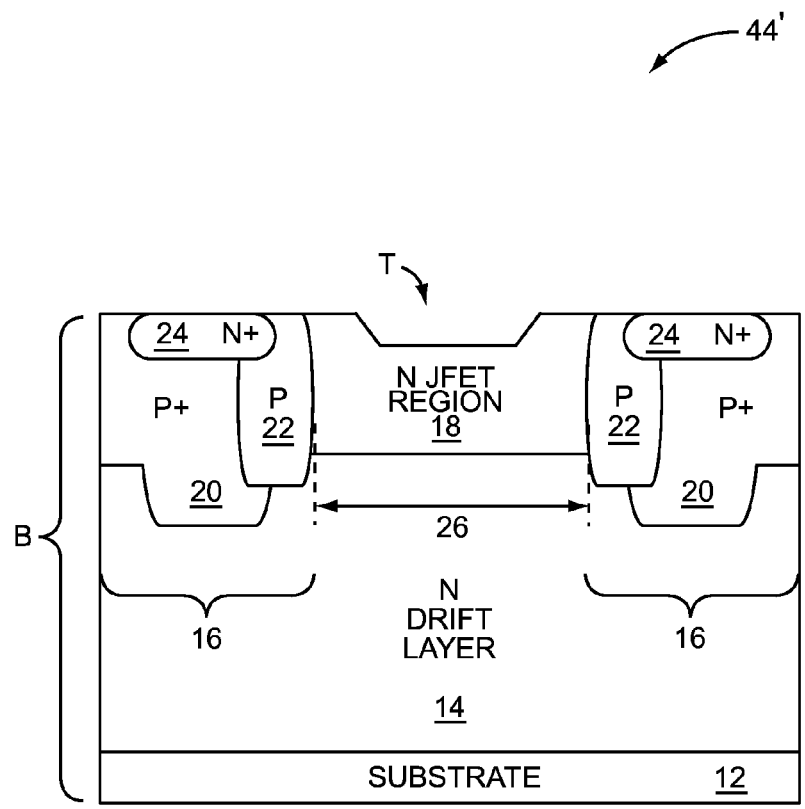

Initially, the trench T is etched into top surface of the body B at a central portion of the JFET region 18, as illustrated in FIG. 6B. The trench T is shaped to correspond to the desired thickness and shape of the supplemental gate dielectric 46, which will subsequently be formed in the trench T. As such, the trench T may directly correspond to the thickness, size, shape, side wall profile, and corner profile, of the desired supplemental gate dielectric 46.

Figure 6C:
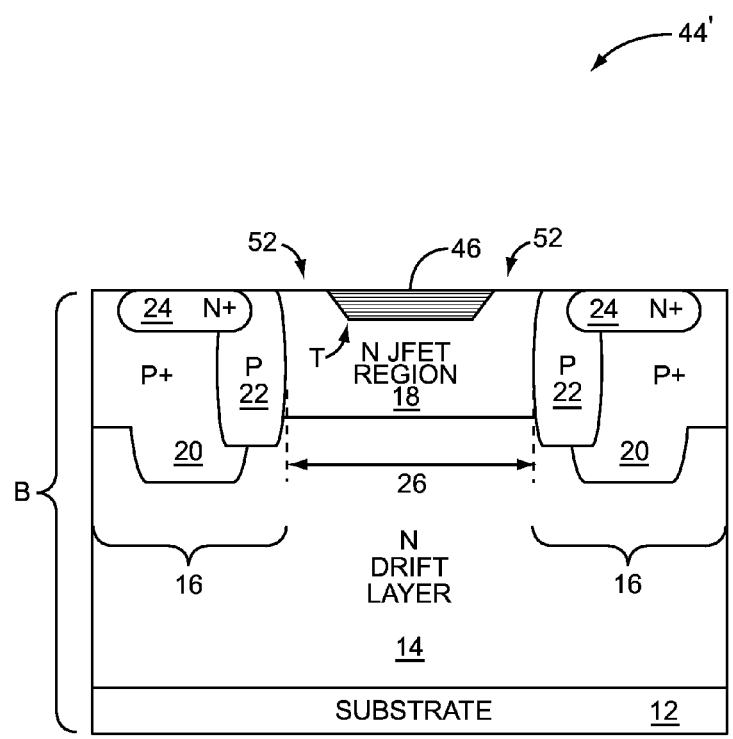

Next, a supplemental dielectric layer is formed in the trench T and perhaps over the rest of the top surface of the body B using a deposition or thermal growth process. The thickness of the supplemental dielectric layer will generally correspond to the desired thickness of the supplemental gate dielectric 46. In this embodiment, the thickness of the trench T corresponds to the desired thickness of the supplemental gate dielectric 46. Once formed, the supplemental dielectric layer is annealed and then etched to remove those portions of the supplemental dielectric layer that are outside of the trench T, as illustrated in FIG. 6C.

Figure 6D:
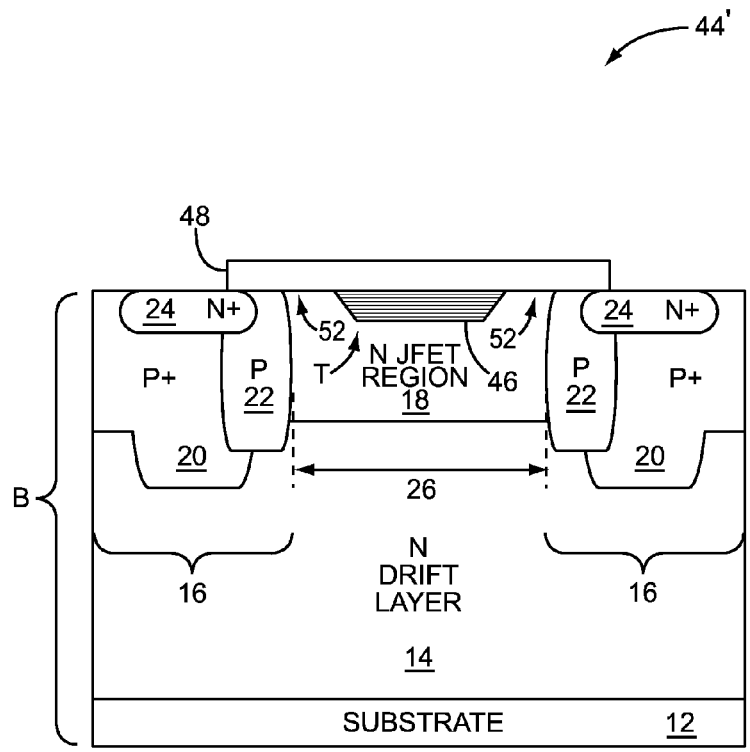
Figure 6E:
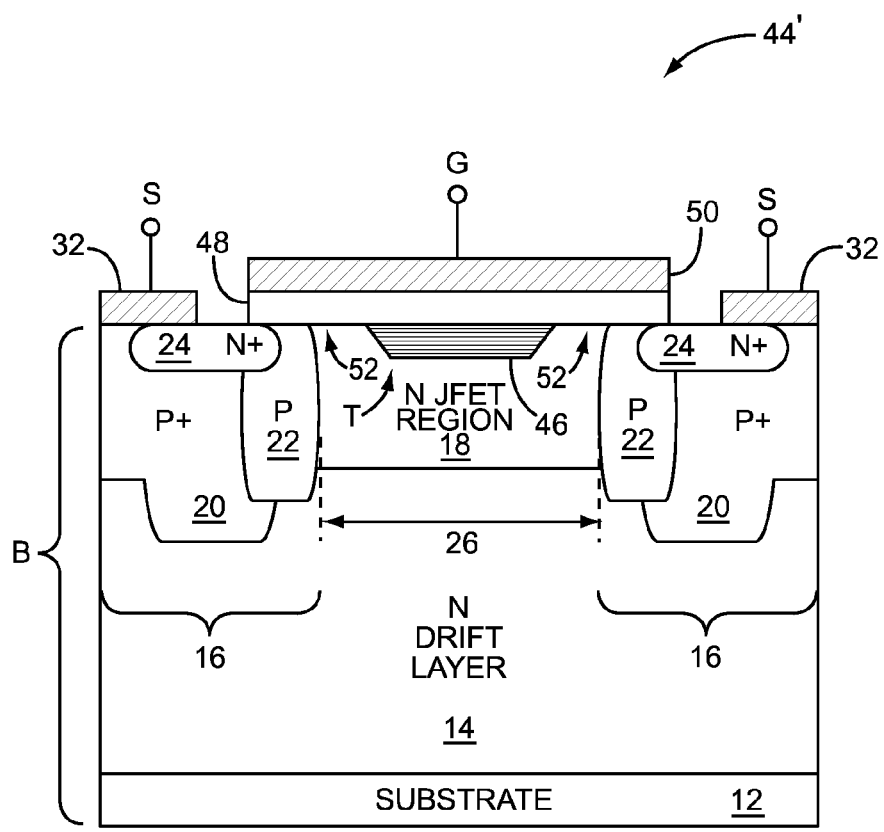
Figure 6F:
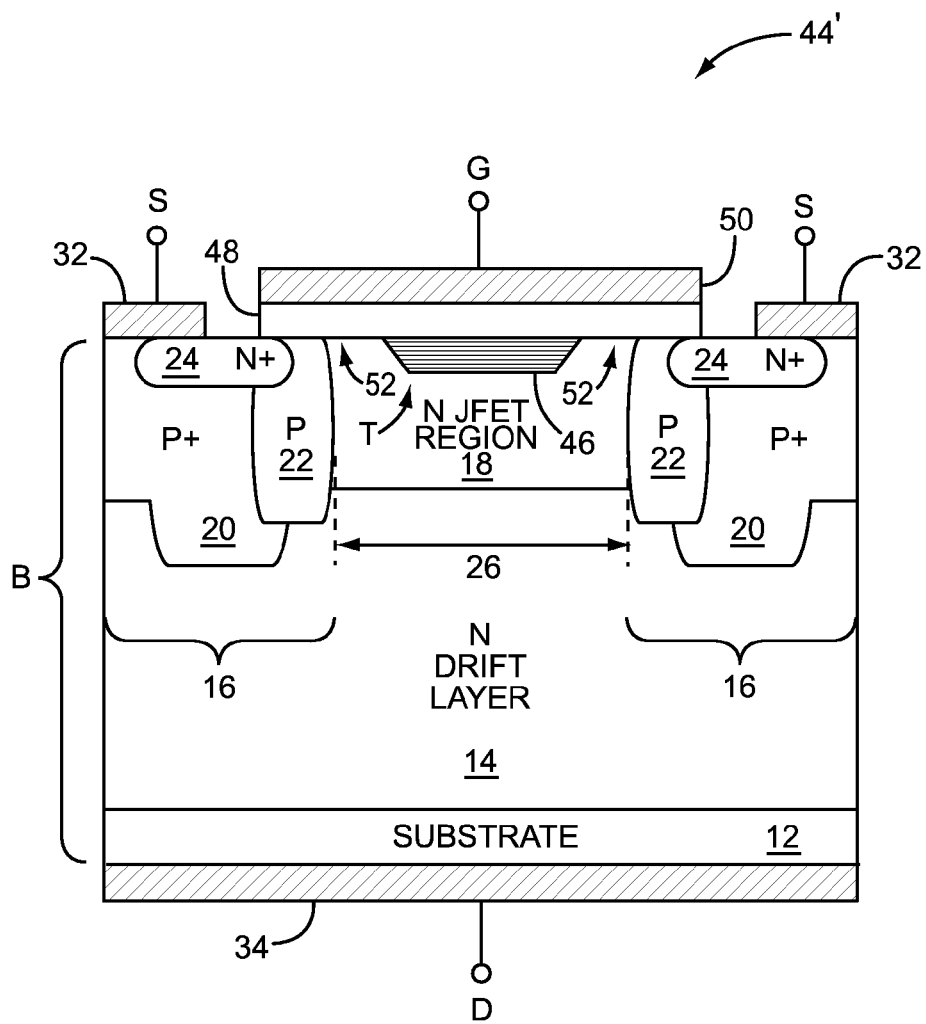

After the supplemental gate dielectric 46 is formed, a primary dielectric layer is formed over the supplemental gate dielectric 46 and at least a portion of the top surface of the body B using a deposition or thermal growth process. The thickness of the primary dielectric layer will generally correspond to the desired thickness of the primary gate dielectric 48. Once formed, the primary dielectric layer may be annealed and then etched to form the primary gate dielectric 48 with the desired size, shape, side wall profile, and corner profile, as illustrated in FIG. 6D. Next, the source contacts 32 and the gate contact 50 are formed, as illustrated in FIG. 6E in the same or successive steps. The source contacts 32 are formed over the top surface of the body B while the gate contact 50 is formed over the primary gate dielectric 48. Finally, the drain contact 34 is formed over the bottom surface of the substrate 12, as shown in FIG. 6F.

For a vertically oriented MOSFET 44, the gate structure of the present disclosure allows the effective thickness of the gate dielectric over the channel to maintain a desired thickness while the gate dielectric over the central portion of the JFET region 18 is substantially thicker than that provided over the channel. Particularly for Silicon Carbide (SiC) based devices, providing a thicker gate dielectric over the central portion of the JFET region 18 helps provide a higher quality interface between the gate dielectric and the drift layer 14. Improving this interface is beneficial, especially when either or both of the gate dielectric or the drift layer 14 are chemically modified around the channel region in an effort to further increase electron mobility.

Providing a thicker gate dielectric over the central portion of the JFET region 18 also functions to reduce the gate dielectric fields in the JFET region 18 at the gate dielectric interface in both the ON and OFF states as well as to reduce the gate-to-drain capacitance for the MOSFET 44. Reducing the gate-to-drain capacitance results in better switching performance. Reducing the gate dielectric fields not only improves device reliability, but also results in lower gate leakage in the ON state as well as lower gate leakage and higher breakdown voltages in the OFF state, or blocking state.

Figure 7:
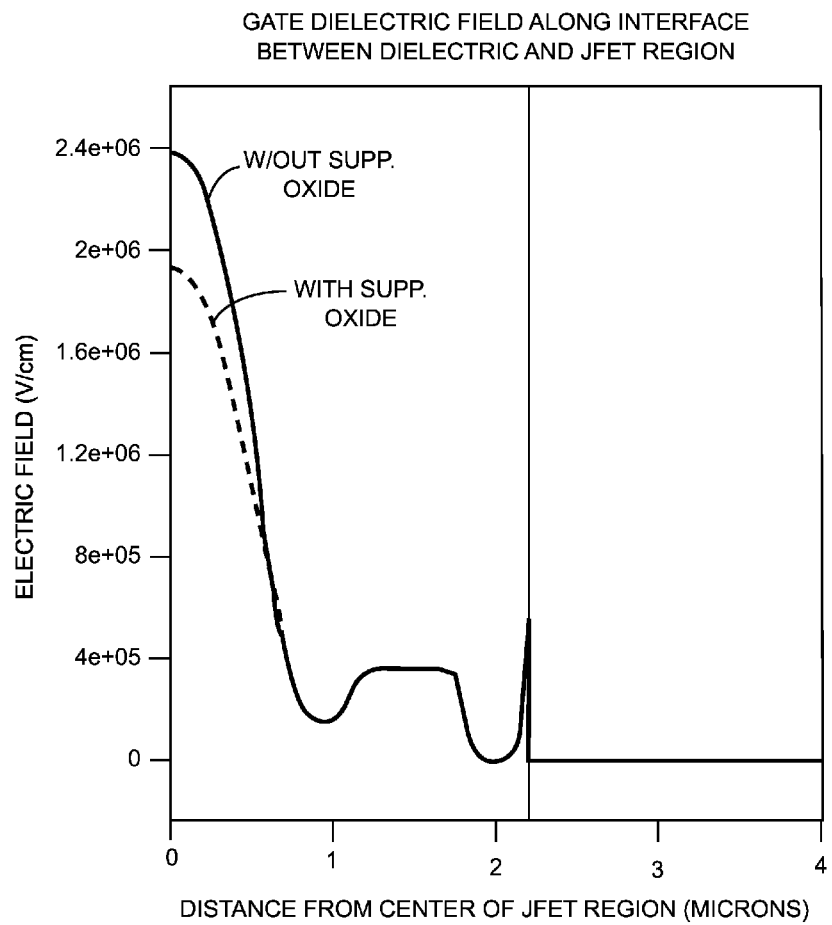
FIG. 7 shows a graph indicating gate dielectric field improvements achieved by the MOSFETs with the enhanced gate structure of the present disclosure over conventional MOSFETs.

FIG. 7 compares the gate dielectric field at the interface of the JFET region 18 and the gate dielectric between the conventional MOSFET 10 and the present MOSFET 44, corresponding to the OFF state blocking conditions. With a blocking voltage of 1200V, the peak electric field at the interface may be lowered from 2.4 MV/cm to 1.95 MV/cm by adding a supplemental gate dielectric 46 with a thickness of 50 nm below a primary gate dielectric 48 having a thickness of 50 nm. Notably, the y-axis of the graph in FIG. 7 corresponds to a central point along the interface of the JFET region 18 and the gate dielectric. The central point along this interface is typically the point where the peak electric fields are reached.

Figure 8:
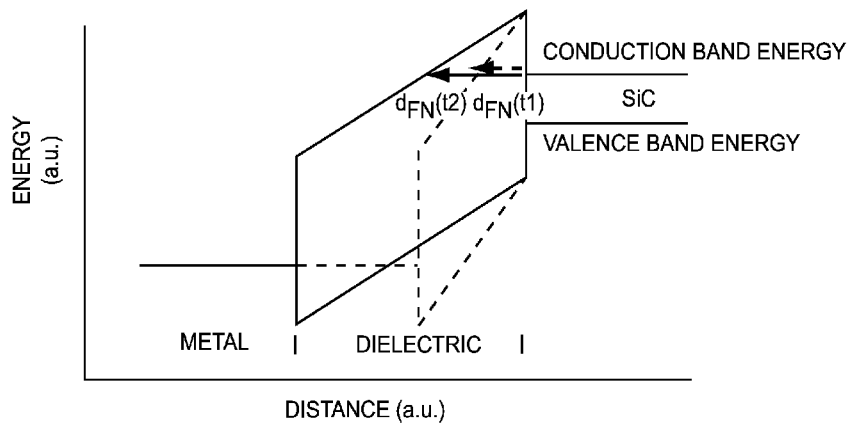
FIG. 8 shows a graph indicating performance improvements achieved by the MOSFETs with the enhanced gate structure of the present disclosure over conventional MOSFETs.

FIG. 8 illustrates how the supplemental gate dielectric 46 in the MOSFET 44 will reduce the gate dielectric field over the JFET region 18 for ON state fields. For a fixed voltage drop across both the single gate dielectric 28 of the conventional MOSFET 10 or the combined supplemental and primary gate dielectrics 46, 48 of the MOSFET 44, the gate dielectric field for the MOSFET 44 is reduced by a factor of two when the effect thickness of the gate dielectric doubles (from t2 to t1). Reducing the gate dielectric field by a factor of two corresponds to doubling the tunneling distance, $d_{FN}$, thereby lowering leakage currents and extending operating lifetime.

Figure 9:
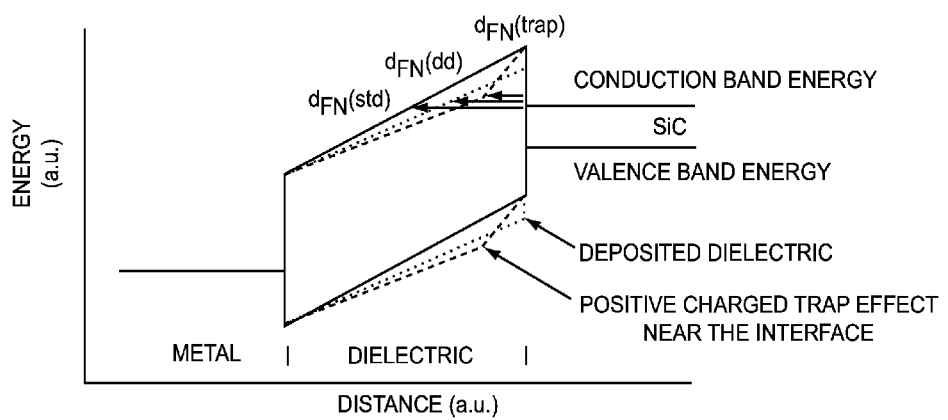
FIG. 9 shows a graph indicating quality improvements achieved by the MOSFETs with the enhanced gate structure of the present disclosure over conventional MOSFETs.

FIG. 9 illustrates why use of the supplemental gate dielectric 46 may help improve the quality of the interface between the JFET region 18 and the gate dielectrics, when the interface is chemically modified to improve channel mobility. FIG. 9 particularly shows that if the supplemental gate dielectric 46 is not used, a deposited gate dielectric 28 will have a lower barrier height, and thus, a shorter tunnel distance $d_{FN}$ (dd). Further, positively charged near-interface traps (trap effect) from chemically modified gate dielectrics 28 can shorten the tunnel distance $d_{FN}$ (trap), compared to standard, non-chemically modified gate dielectrics 28 on SiC $d_{FN}$ (std).

The substrate 12 may be an N-doped, single crystal, SiC substrate 12. The substrate 12 may have various crystalline polytypes, such as 2H, 4H, 6H, 3C and the like. In other embodiments, the substrate 12 may also be formed from other material systems, such as gallium nitride (GaN), gallium arsenide (GaAs), silicon germanium (SiGe), and the like. The substrate may be heavily doped with an N-type dopant at concentrations of between about $5 \times 10^{17}$ cm$^{-3}$ and $1 \times 10^{21}$ cm$^{-3}$ and have a thickness of between about 150 microns and 400 microns; however, the doping concentrations and thicknesses of the substrate 12 and the other layers may vary based on the desired parameters of the MOSFET 44.

A SiC drift layer 14 may be grown over the substrate 12 and doped in situ, wherein the drift layer 14 is lightly to moderately doped as it is grown with an N-type doping material. Notably, one or more buffer layers (not shown) may be formed on the substrate 12 prior to forming the drift layer 14. The buffer layer(s) may be used as a nucleation layer and be relatively heavily doped with an N-type doping material.

The drift layer 14 may be relatively uniformly doped throughout or may employ graded doping throughout all or a portion thereof. For a uniformly doped drift layer 14, the doping concentration may be between about $1 \times 10^{15}$ cm$^{-3}$ and $1 \times 10^{17}$ cm$^{-3}$ in one embodiment. With graded doping, the doping concentration is highest at the bottom of the drift layer 14 near the substrate 12 and lowest at the top of the drift layer 14. The doping concentration generally decreases in a stepwise or continuous fashion from a point at or near the bottom to a point at or near the top of the drift layer 14. In one embodiment employing graded doping, the lower portion of the drift layer 14 may be doped at a concentration of about $1 \times 10^{15}$ cm$^{-3}$ and the upper portion of the drift layer 14 may be doped at a concentration of about $1 \times 10^{17}$ cm$^{-3}$. The drift layer 14 may be between three and twelve microns thick in select embodiments depending on the desired parameters of the MOSFET 44.

Each one of the junction implants 16 may be about 0.2-2.0 microns thick, and the JFET region 18 may be about 0.1-1.5 microns thick. The deep well region 20 may be heavily doped with a P-type dopant at a concentration from about $5 \times 10^{17}$ cm$^{-3}$ to $1 \times 10^{20}$ cm$^{-3}$. The JFET region 18 may be heavily doped with an N-type dopant at a concentration from about $1 \times 10^{16}$ cm$^{-3}$ to $5 \times 10^{17}$ cm$^{-3}$. The base region 22 may be moderately doped with a P-type dopant at a concentration from about $5 \times 10^{16}$ cm$^{-3}$ to $1 \times 10^{19}$ cm$^{-3}$. The source region 24 may be heavily doped with an N-type dopant at a concentration from about $1 \times 10^{19}$ cm$^{-3}$ to $1 \times 10^{21}$ cm$^{-3}$. As will be appreciated by those of ordinary skill in the art, the N-type dopant agent may be nitrogen, phosphorous, or any other suitable element, and the P-type dopant may be aluminum, boron, or any other suitable element.

The gate contact 50, the source contacts 32, and the drain contact 34 may be formed from one or more layers. For example, each one of the contacts may include a first layer of nickel or nickel-aluminum, a second layer of titanium over the first layer, a third layer of titanium-nickel over the second layer, and a fourth layer of aluminum over the third layer. Those of ordinary skill in the art will appreciate that the gate contact 50, the source contacts 32, and the drain contact 34 may be formed of any suitable material.

Those skilled in the art will recognize improvements and modifications to the preferred embodiments of the present disclosure. For example, the gate structure disclosed herein is applicable to other field effect devices, such as insulated gate bipolar transistors (IGBTs), junction barrier Schottky diodes, High electron-mobility transistors (HEMTs) and the like. All such improvements and modifications are considered within the scope of the concepts disclosed herein and the claims that follow.

What is claimed is:

1. A vertically oriented field effect device comprising:
   a body comprising a junction gate field effect transistor (JFET) region disposed between junction implants that extend into the body from a top surface of the body;
   a supplemental gate dielectric formed over the top surface of the body above the JFET region such that the supplemental gate dielectric is separated from the junction implants by a gap;
   a primary gate dielectric formed over the supplemental gate dielectric, above the gap over the top surface of the body, and over at least a portion of the junction implants; and
   a gate contact formed over the primary gate dielectric.

2. The field effect device of claim 1 wherein the top surface of the body is substantially planar over the JFET region and the junction implants.

3. The field effect device of claim 2 further comprising source contacts formed over the junction implants, wherein the source contacts are spaced apart from the gate contact and reside on a plane on which the supplemental gate dielectric resides.

4. The field effect device of claim 1 wherein a trench is formed into the JFET region from the top surface and the supplemental gate dielectric is formed in the trench, which is separated from the junction implants by the gap.

5. The field effect device of claim 4 further comprising source contacts formed over the junction implants, wherein the source contacts are spaced apart from the gate contact and reside on a different plane than a plane on which the supplemental gate dielectric resides.

6. The field effect device of claim 5 wherein side walls of the trench form an acute angle relative to the top surface.

7. The field effect device of claim 1 wherein side walls of the supplemental gate dielectric form an acute angle relative to the top surface.

8. The field effect device of claim 1 wherein the supplemental gate dielectric is formed from a first dielectric material, and the primary gate dielectric is also formed from the first dielectric material.

9. The field effect device of claim 8 wherein the first dielectric material is silicon dioxide.

10. The field effect device of claim 1 wherein the supplemental gate dielectric is formed from silicon dioxide.

11. The field effect device of claim 1 wherein the supplemental gate dielectric is formed from at least one of aluminum oxide and magnesium oxide.

12. The field effect device of claim 1 wherein the supplemental gate dielectric is formed from a first dielectric material, and the primary gate dielectric is formed from a second dielectric material, which is different than the first dielectric material.

13. The field effect device of claim 12 wherein the first dielectric material is at least one of aluminum oxide and magnesium oxide.

14. The field effect device of claim 13 wherein the second dielectric material is silicon dioxide.

15. The field effect device of claim 1 wherein the supplemental gate dielectric is formed from a first material, the JFET region is formed from a second material, and the first material has a bandgap that is higher than that of the second material.

16. The field effect device of claim 1 wherein the supplemental gate dielectric is formed from a first material, the JFET region is formed from a second material, and the first material has a bandgap that is at least 1.5 times that of the second material.

17. The field effect device of claim 1 wherein the supplemental gate dielectric is formed from a first material, the JFET region is formed from a second material, and the first material has a bandgap that is at least two times that of the second material.

18. The field effect device of claim 1 wherein the supplemental gate dielectric is an annealed dielectric material.

19. The field effect device of claim 1 further comprising a drain contact formed over a bottom surface of the body.

20. The field effect device of claim 19 further comprising source contacts formed over the junction implants, wherein the source contacts are spaced apart from the gate contact.

21. A vertically oriented field effect device comprising:
   a body comprising a junction gate field effect transistor (JFET) region disposed between junction implants that extend into the body from a top surface of the body;
   a supplemental gate dielectric formed on the top surface of the body over the JFET region such that the supplemental gate dielectric is separated from the junction implants by a gap;
   a primary gate dielectric formed over the supplemental gate dielectric, above the gap on the top surface of the body, and over at least a portion of the junction implants;
   a gate contact formed over the primary gate dielectric; and
   a drain contact formed over a bottom surface of the body,
   wherein:
      the supplemental gate dielectric is formed from a first material, the JFET region is formed from a second material, and the first material has a bandgap that is higher than that of the second material; and
      the supplemental gate dielectric is formed from a first dielectric material, and the primary gate dielectric is formed from a second dielectric material, which is different than the first dielectric material.

22. The field effect device of claim 21 wherein the first material has a bandgap that is at least 1.5 times that of the second material.

23. The field effect device of claim 21 wherein the second material is silicon carbide.

24. The field effect device of claim 23 wherein the second dielectric material is silicon dioxide.

25. A method for forming a vertically oriented field effect device comprising:
   providing a body comprising a junction gate field effect transistor (JFET) region disposed between junction implants that extend into the body from a top surface of the body;

forming a supplemental gate dielectric over the top surface of the body above the JFET region such that the supplemental gate dielectric is separated from the junction implants by a gap;

forming a primary gate dielectric over the supplemental gate dielectric, above the gap over the top surface of the body, and over at least a portion of the junction implants; and forming a gate contact over the primary gate dielectric.

26. The method of claim 25 further comprising, prior to forming the primary gate dielectric, annealing the supplemental gate dielectric.

27. The method of claim 26 wherein the top surface of the body is substantially planar over the JFET region and the junction implants.

28. The method of claim 27 further comprising forming source contacts over the junction implants, wherein the source contacts are spaced apart from the gate contact and reside on a plane on which the supplemental gate dielectric resides.

29. The method of claim 25 further comprising forming a trench that extends into the JFET region from the top surface prior to forming the supplemental gate dielectric, wherein the supplemental gate dielectric is subsequently formed in the trench, which is separated from the junction implants by the gap.

\* \* \* \* \*